(12) United States Patent
Taniguchi

(10) Patent No.: US 10,944,376 B2
(45) Date of Patent: Mar. 9, 2021

(54) LC RESONATOR AND LC FILTER

(71) Applicant: Murata Manufacturing Co., Ltd., Nagaokakyo (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 7 days.

(21) Appl. No.: 16/427,558

(22) Filed: May 31, 2019

(65) Prior Publication Data

US 2019/0305745 A1 Oct. 3, 2019

Related U.S. Application Data

(63) Continuation of application No. PCT/JP2017/038251, filed on Oct. 24, 2017.

(30) Foreign Application Priority Data

Dec. 2, 2016 (JP) .............................. JP2016-235229

(51) Int. Cl.
| | |
|---|---|
| *H03H 7/01* | (2006.01) |
| *H03H 7/09* | (2006.01) |
| *H03H 9/24* | (2006.01) |
| *H01F 17/00* | (2006.01) |
| *H03H 7/075* | (2006.01) |
| *H01F 27/00* | (2006.01) |
| *H03H 1/00* | (2006.01) |

(52) U.S. Cl.
CPC ............ *H03H 7/1775* (2013.01); *H01F 17/00* (2013.01); *H01F 27/00* (2013.01); *H03H 7/075* (2013.01); *H03H 7/09* (2013.01); *H03H 7/1791* (2013.01); *H03H 9/24* (2013.01); *H03H 2001/0085* (2013.01)

(58) Field of Classification Search
CPC ......... H03H 2001/0085; H03H 7/1791; H03H 7/09; H03H 7/0115
USPC .................................................. 333/175, 185
See application file for complete search history.

(56) References Cited

U.S. PATENT DOCUMENTS

| | | | | |
|---|---|---|---|---|
| 3,718,874 A | * | 2/1973 | Cooper, Jr. .......... | H03H 7/0161 333/204 |
| 2015/0303890 A1 | | 10/2015 | Taniguchi | |
| 2016/0156324 A1 | | 6/2016 | Watanabe | |

FOREIGN PATENT DOCUMENTS

| | | |
|---|---|---|
| EP | 2 009 787 A1 | 12/2008 |
| JP | 2006-262349 A | 9/2006 |
| JP | 2016-111377 A | 6/2016 |
| WO | 2007/119356 A1 | 10/2007 |

(Continued)

OTHER PUBLICATIONS

Official Communication issued in International Patent Application No. PCT/JP2017/038251, dated Jan. 9, 2018.

*Primary Examiner* — Rakesh B Patel
(74) *Attorney, Agent, or Firm* — Keating & Bennett, LLP

(57) ABSTRACT

An LC resonator includes a laminate body including dielectric layers that are laminated in a lamination direction. The LC resonator includes a first capacitor, a second capacitor, and an inductor connected between the first capacitor and the second capacitor. A first end of the inductor is isolated in a direct current from a ground node by the first capacitor. A second end of the inductor is isolated in a direct current from the ground node by the second capacitor.

19 Claims, 7 Drawing Sheets

(56) References Cited

FOREIGN PATENT DOCUMENTS

WO 2010/100997 A1 9/2010
WO 2015/059964 A1 4/2015

* cited by examiner

LC RESONATOR AND LC FILTER

CROSS REFERENCE TO RELATED APPLICATIONS

This application claims the benefit of priority to Japanese Patent Application No. 2016-235229 filed on Dec. 2, 2016 and is a Continuation Application of PCT Application No. PCT/JP2017/038251 filed on Oct. 24, 2017. The entire contents of each of these applications are hereby incorporated herein by reference.

BACKGROUND OF THE INVENTION

1. Field of the Invention

The present invention relates to an LC resonator and an LC filter including the LC resonator.

2. Description of the Related Art

LC filters including LC resonators are known. For example, International Publication No. 2007/119356 discloses a multilayer band pass filter in which a plurality of LC parallel resonators are juxtaposed to each other in a laminate body including a plurality of laminated dielectric layers.

The LC parallel resonator disclosed in International Publication No. 2007/119356 includes a loop inductor formed of a line conductive pattern formed on a dielectric layer, a via conductive pattern extending from a capacitor conductive pattern formed on another dielectric layer to the line conductive pattern, and another via conductive pattern extending from the line conductive pattern to a ground electrode. The inductor is connected to the ground electrode by a via conductive pattern.

When a current flows from the inductor to the ground electrode and another conductor connected to the ground electrode, there is a case in which the ground electrode and another conductor connected to the ground electrode function as inductors that are not expected in designing an LC filter. In a case in which the ground electrode and another conductor connected to the ground electrode function as inductors in the LC filter required to have a high-precision filtering function for high-frequency signals, they may have non-negligible influences on the characteristics (insertion loss or return loss) of the LC filter. However, during the design phase of an LC filter, it is difficult to predict which conductor the ground electrode is to be connected to and how the ground electrode is to be connected to a conductor when the LC filter is installed. The characteristics (insertion loss or return loss) of the LC filter may therefore deviate from desired characteristics.

SUMMARY OF THE INVENTION

Preferred embodiments of the present invention reduce or prevent deviation of characteristics of an LC filter from desired characteristics.

An LC resonator according to a preferred embodiment of the present invention includes a laminate body in which a plurality of dielectric layers are laminated in a lamination direction. The LC resonator includes a first capacitor, a second capacitor, and an inductor. The inductor is connected between the first capacitor and the second capacitor. One end of the inductor is isolated in a direct current from a ground node by the first capacitor and the other end of the inductor is isolated in a direct current from the ground node by the second capacitor.

In an LC resonator according to a preferred embodiment of the present invention, one end of an inductor is isolated in a direct current from a ground node by a first capacitor and the other end of the inductor is isolated in a direct current from the ground node by a second capacitor. Since the inductor is isolated in a direct current from a ground electrode connected to the ground node, the ground electrode and another conductor connected to the ground electrode are prevented from defining and functioning as inductors. As a result, the deviation of the characteristics of an LC filter including the LC resonator from desired characteristics is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
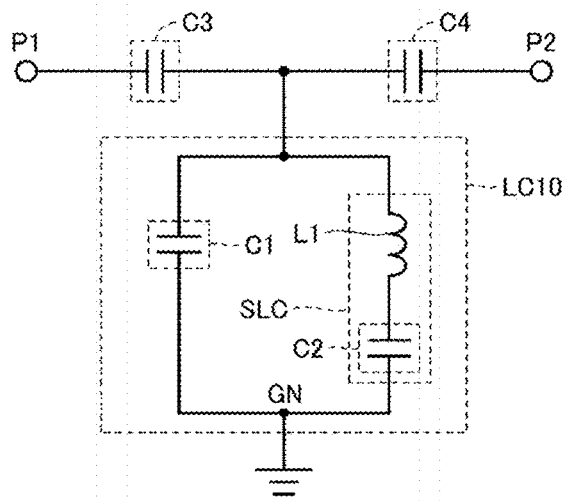
FIG. 1 is an equivalent circuit diagram of a band pass filter that is an example of an LC filter according to a first preferred embodiment of the present invention.

Preferred embodiments of the present invention will be described in detail below with reference to the accompanying drawings. In the drawings, the same reference numerals are used to represent the same or similar portion or the corresponding portions so as to avoid repeated explanation.

First Preferred Embodiment

FIG. 1 is an equivalent circuit diagram of a band pass filter 1 that is an example of an LC filter according to the first preferred embodiment. As illustrated in FIG. 1, the band pass filter 1 includes an LC resonator LC10, input/output terminals P1 and P2, and capacitors C3 and C4.

The LC resonator LC10 includes an inductor L1 and capacitors C1 and C2. One end of the inductor L1 is connected to a ground node GN via the capacitor C1. The other end of the inductor L1 is connected to the ground node GN via the capacitor C2.

The LC resonator LC10 may be considered as an LC parallel resonator in which the inductor L1 and a capacitor including the capacitors C1 and C2 are connected in parallel to each other. The inductor L1 and the capacitor C2 define an LC series resonator SLC.

One end of the inductor L1 is connected to the input/output terminal P1 via the capacitor C3. One end of the inductor L1 is connected to the input/output terminal P2 via the capacitor C4.

When a current flows from the inductor to a ground electrode connected to the ground node GN and another conductor connected to the ground electrode, there is a case in which the ground electrode and the conductor connected to the ground electrode define and function as inductors that are not expected in designing the band pass filter 1. In a case in which the ground electrode and another conductor connected to the ground electrode define and function as inductors in the band pass filter 1 required to have a high-precision filtering function for high-frequency signals, they may have non-negligible influences on the characteristics (insertion loss or return loss) of the band pass filter 1. However, during the design phase of the band pass filter 1, it is difficult to predict which conductor the ground electrode is to be connected to and how the ground electrode is to be connected to a conductor when the band pass filter 1 is installed. The characteristics (insertion loss or return loss) of the band pass filter 1 may, therefore, deviate from desired characteristics.

In the first preferred embodiment, one end of the inductor L1 is isolated in a direct current from the ground node GN by the capacitor C1 and the other end of the inductor L1 is isolated in a direct current from the ground node GN by the capacitor C2. Since the inductor L1 is isolated in a direct current from the ground electrode connected to the ground node GN, the ground electrode and another conductor connected to the ground electrode are prevented from defining and functioning as inductors. As a result, the deviation of the characteristics of the band pass filter 1 from desired characteristics is able to be reduced or prevented.

In addition, in the first preferred embodiment, one end of the inductor L1 is isolated in a direct current from the input/output terminal P1 by the capacitor C3 and the other end of the inductor L1 is isolated in a direct current from the input/output terminal P2 by the capacitor C4. Since the inductor L1 is also isolated in a direct current from input/output terminals P1 and P2, the input/output terminals P1 and P2 and other conductors connected to the input/output terminals P1 and P2 are prevented from defining and functioning as inductors. As a result, the deviation of the characteristics of the band pass filter 1 from desired characteristics is able to be further reduced or prevented.

Figure 2:
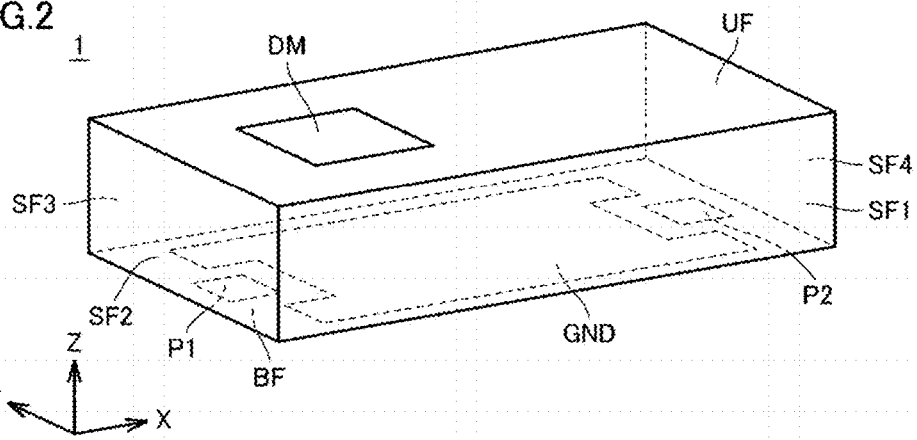
FIG. 2 is an external perspective view of the band pass filter illustrated in FIG. 1.

A case in which the band pass filter 1 includes a laminate body including a plurality of dielectrics will be described below. FIG. 2 is an external perspective view of the band pass filter 1 illustrated in FIG. 1. As illustrated in FIG. 2, a lamination direction (the height direction of the band pass filter 1) is the Z-axis direction, the longer side (width) direction of the band pass filter 1 is the X-axis direction, and the shorter side (depth) direction of the band pass filter 1 is the Y-axis direction. The X axis, the Y axis, and the Z axis are orthogonal or substantially orthogonal to one another.

The band pass filter 1 preferably has, for example, a rectangular or substantially rectangular parallelepiped shape. The surfaces of the band pass filter 1, which extend along a direction perpendicular or substantially perpendicular to the lamination direction, are a bottom surface BF and an upper surface UF. The surfaces of the band pass filter 1, which extend along a ZX plane among surfaces parallel or substantially parallel to the lamination direction, are side surfaces SF1 and SF3. The surfaces of the band pass filter 1, which extend along an YZ plane among the surfaces along the lamination direction, are side surfaces SF2 and SF4.

On the bottom surface BF, the input/output terminals P1 and P2 and a ground electrode GND are provided. The input/output terminals P1 and P2 and the ground electrode GND are preferably, for example, land grid array (LGA) terminals defined by regularly arranging planar electrodes on the bottom surface BF.

A direction identification mark DM is provided on the upper surface UF. The direction identification mark DM identifies a direction of the band pass filter 1 during installation.

Figure 3:
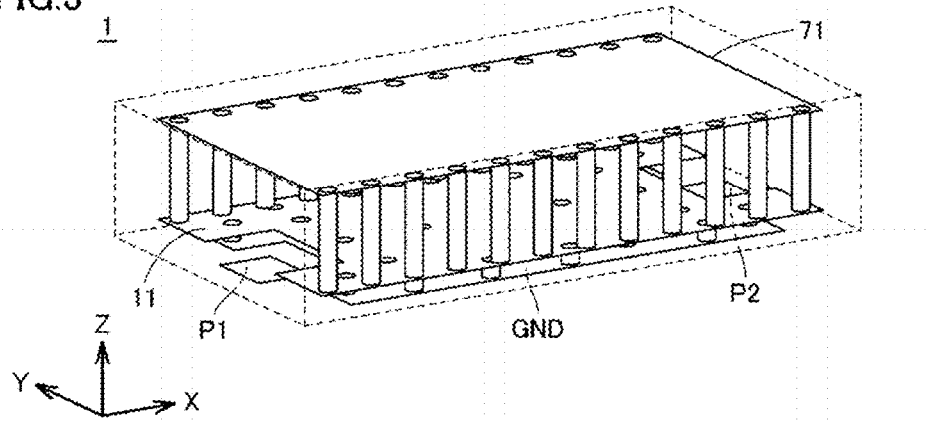
FIG. 3 is a diagram illustrating two ground conductive patterns provided in the band pass filter illustrated in FIG. 2.

FIG. 3 illustrates two ground conductive patterns 11 and disposed in the band pass filter 1 illustrated in FIG. 2. Although the LC resonator LC10 is disposed between the ground conductive patterns 11 and 71 in the band pass filter 1, the LC resonator LC10 is not illustrated for the simplification of FIG. 3. The structure of the LC resonator LC10 will be described below with reference to FIG. 4.

As illustrated in FIG. 3, the ground conductive pattern 71 is connected to the ground conductive pattern 11 by a plurality of via conductive patterns. The ground conductive pattern 11 is connected to the ground electrode GND by a plurality of via conductive patterns. Thus, since the ground electrode GND and the ground conductive pattern 11 are connected by the via conductive patterns and the ground conductive patterns 11 and 71 are connected by the via conductive patterns, the ground conductive patterns 11 and 71 are able to be maintained at the same or substantially the same potential as the ground electrode GND.

Figure 4:
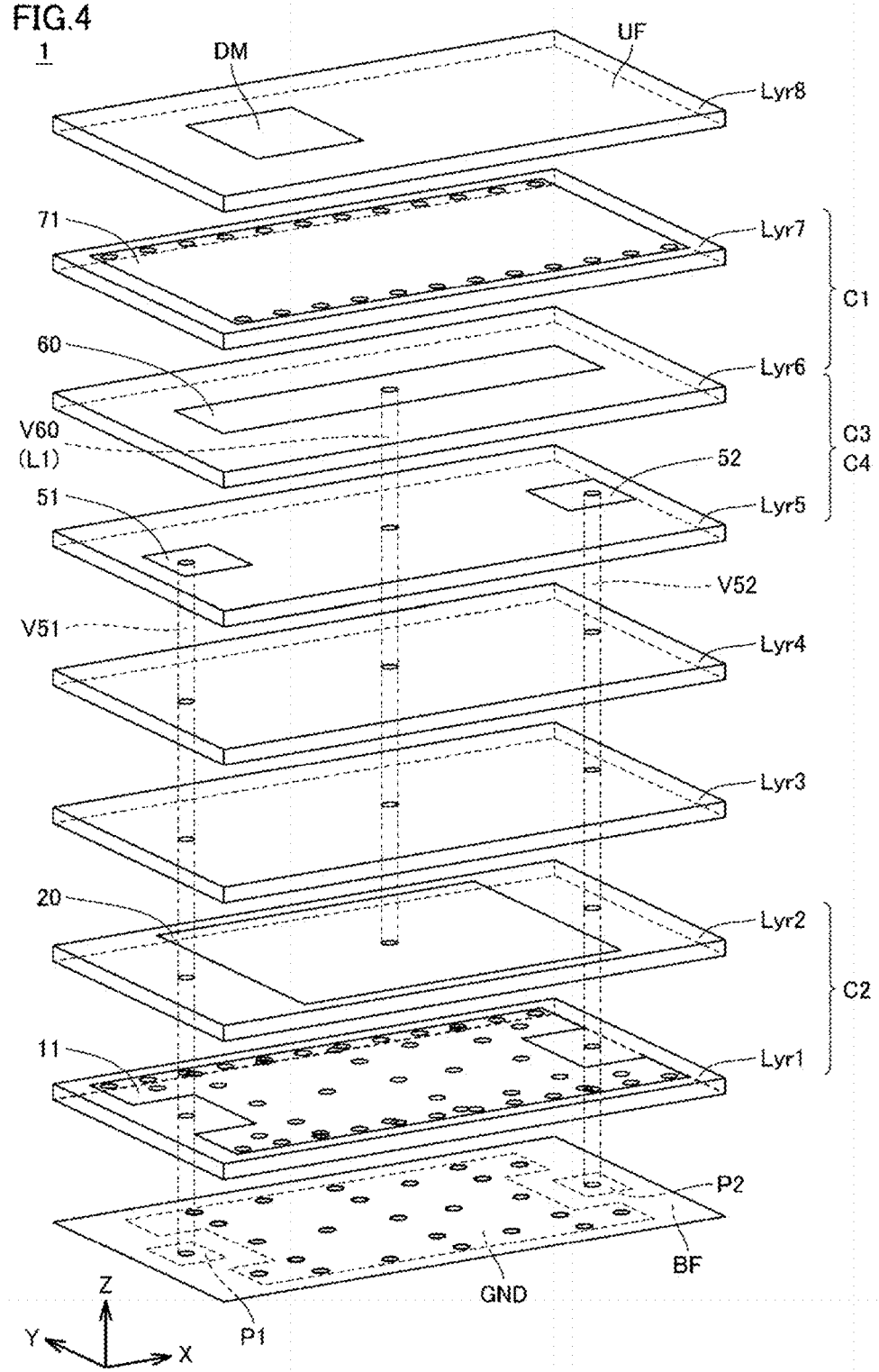
FIG. 4 is an exploded perspective view illustrating an exemplary layered structure of the band pass filter in FIG. 1.

FIG. 4 is an exploded perspective view illustrating an exemplary layered structure of the band pass filter illustrated in FIG. 1. As illustrated in FIG. 4, the band pass filter 1 includes a laminate body in which a plurality of dielectric layers Lyr1 to Lyr8 are laminated in the Z-axis direction. The dielectric layers Lyr1 to Lyr8 are laminated in this order in the Z-axis direction such that the dielectric layer Lyr1 is located on the side of the bottom surface BF and the dielectric layer Lyr8 is located on the side of the upper surface UF. In FIG. 4, to improve the visibility of the structure of the LC resonator LC10, the via conductive patterns that connect the ground electrode GND and the ground conductive pattern 11 and the via conductive patterns that connect the ground conductive patterns 11 and 71 are not illustrated.

As described above, on the bottom surface BF of the dielectric layer Lyr1, the input/output terminals P1 and P2 and the ground electrode GND are provided. On the dielectric layer Lyr1, the ground conductive pattern 11 is further provided. As described above, the ground conductive pattern 11 is connected to the ground electrode GND by the conductive patterns (not illustrated).

On the dielectric layer Lyr2, a capacitor conductive pattern 20 is provided. The capacitor conductive pattern 20 and the ground conductive pattern 11 define the capacitor C2.

On the dielectric layer Lyr5, capacitor conductive patterns 51 and 52 are provided. The capacitor conductive patterns 51 and 52 are connected to the input/output terminals P1 and P2 by the via conductive patterns V51 and V52, respectively.

On the dielectric layer Lyr6, a capacitor conductive pattern 60 is provided. The capacitor conductive pattern 60 is connected to the capacitor conductive pattern 20 by an inductor via conductive pattern V60. The inductor via conductive pattern V60 defines and functions as the inductor L1. The capacitor conductive pattern 60 and the capacitor conductive pattern 51 define the capacitor C3 and the capacitor conductive pattern 60 and the capacitor conductive pattern 52 define the capacitor C4.

On the dielectric layer Lyr7, the ground conductive pattern 71 is provided. The capacitor conductive pattern 60 and the ground conductive pattern 71 define the capacitor C1. As described above, the ground conductive pattern 71 is connected to the ground conductive pattern 11 by the via conductive patterns (not illustrated).

As described above, on the upper surface UF of the dielectric layer Lyr8, the direction identification mark DM is provided.

Referring back to FIG. 1, at a resonant frequency fr1 of an LC resonator 10 which is defined by the following equation (1), the impedance of the LC resonator 10 becomes very high (approaches infinity). Near the resonant frequency fr1, a signal transmitted from the input/output terminal P1 or P2 is difficult to pass through the LC resonator LC10 and is easily transmitted from one of the input/output terminals to the other one of the input/output terminals. That is, the resonant frequency of the band pass filter 1 at which the minimum insertion loss occurs is a frequency near the resonant frequency fr1 of the LC resonator 10. The resonant frequency of the band pass filter 1 is able to be adjusted by adjusting the resonant frequency fr1.

Equation 1

$$fr1 = \frac{1}{2\pi\sqrt{L1 \cdot \{(C1 \times C2)/(C1 + C2)\}}} \quad (1)$$

At a resonant frequency fr2 of the LC series resonator SLC which is defined by the following Equation (2), the impedance of the LC series resonator SLC becomes very low (approaches 0). Near the resonant frequency fr2, a signal transmitted from the input/output terminal P1 or P2 is easy to pass through the LC resonator LC10. A high proportion of signals transmitted from one of the input/output terminals pass through the LC resonator LC10 and are lost. That is, at a frequency near the resonant frequency fr2, an attenuation pole is generated at which the maximum insertion loss of the band pass filter 1 occurs. A frequency at which the attenuation pole of the band pass filter 1 is generated is able to be adjusted by adjusting the resonant frequency fr2.

Equation 2

$$fr2 = \frac{1}{2\pi\sqrt{L1 \cdot C2}} \quad (2)$$

The following describes how the characteristics of the band pass filter 1 change when the resonant frequencies of the LC resonator 10 and the LC series resonator SLC are changed with reference to FIGS. 5 to 9.

Figure 5:
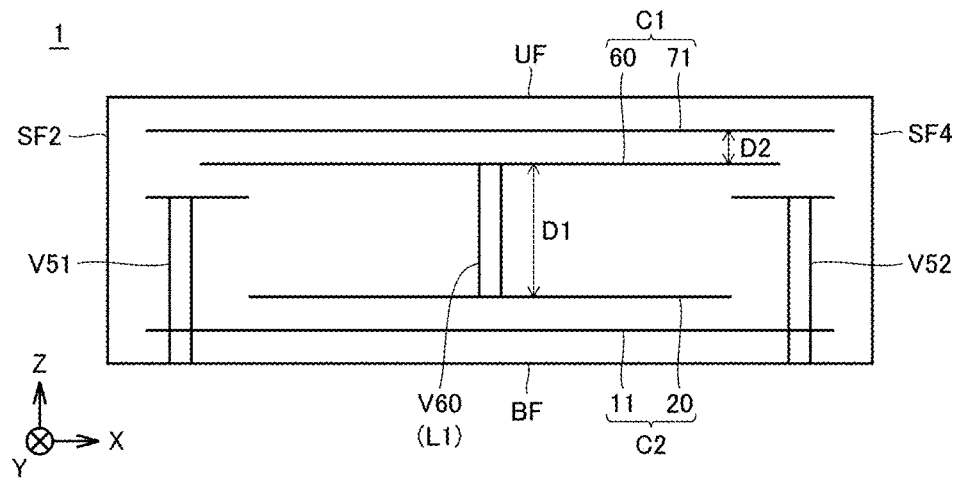
FIG. 5 is a plan view of the band pass filter illustrated in FIG. 4 which is viewed in plan in the Y-axis direction.

FIG. 5 is a plan view of the band pass filter 1 illustrated in FIG. 4 which is viewed in plan in the Y-axis direction. Referring to FIG. 5, when a length D1 (the distance between the capacitor conductive patterns 20 and 60) of the inductor via conductive pattern V60 (the inductor L1) is changed, the inductance of the inductor L1 changes and the resonant frequency fr1 of the LC resonator 10 and the resonant frequency fr2 of the LC series resonator SLC change at the same time. The following describes how the characteristics of the band pass filter 1 change in this case with reference to FIG. 6.

When the area of the capacitor conductive pattern 20 is changed, the capacitance of the capacitor C2 changes and the resonant frequency fr2 of the LC series resonator SLC changes. The following describes how the characteristics of the band pass filter 1 change in this case with reference to FIG. 7.

When a distance D2 between the capacitor conductive pattern 60 and the ground conductive pattern 71 or the area of the capacitor conductive pattern 60 is changed, the capacitance of the capacitor C1 changes and the resonant frequency fr1 of the LC resonator 10 changes. The following describes how the characteristics of the band pass filter 1 change in this case with reference to FIGS. 8 and 9.

Figure 6:
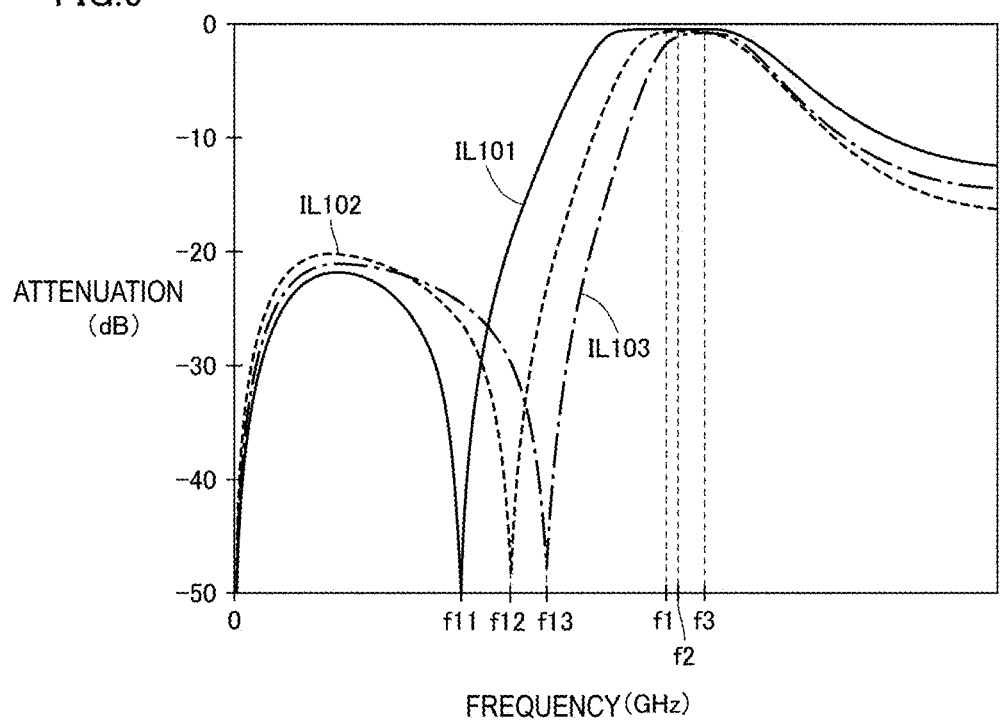
FIG. 6 is a diagram illustrating insertion losses obtained when the length of an inductor via conductive pattern (the inductance of an inductor) is changed in three steps.

FIG. 6 is a diagram illustrating insertion losses IL101 to IL103 obtained when the length of the inductor via conductive pattern V60 (the inductance of the inductor L1) is changed in three steps. In FIG. 6, an attenuation (dB) is represented by a negative value at the vertical axis. The greater the absolute value of an attenuation is, the larger the insertion loss is. The same is true in FIGS. 7 to 9 and 12. This means that the larger the insertion loss is, a higher proportion of signals input into the band pass filter 1 are lost in the band pass filter 1. It is therefore preferable that the insertion loss is small.

The insertion losses IL101 to IL103 illustrated in FIG. 6 are obtained when the lengths of the inductor via conductive pattern V60 are D11 to D13 (D11>D12>D13), respectively. The resonant frequencies of the band pass filter 1 that are obtained in the case of the insertion losses IL101 to IL103 are f1 to f3 (f1<f2<f3), respectively. Frequencies at attenuation poles that are obtained in the case of the insertion losses IL101 to IL103 are f11 to f13 (f11<f12<f13), respectively.

The shorter the length of the inductor via conductive pattern V60 is, the lower the inductance of the inductor L1 is. When the inductance value is small, the resonant frequency of the band pass filter 1 is high as illustrated in FIG. 6 because the resonant frequency fr1 of the LC resonator 10 is high (see Equation (1)). In the band pass filter 1, the resonant frequency of the band pass filter 1 is able to be adjusted by adjusting the length of the inductor via conductive pattern V60.

The shorter the length of the inductor via conductive pattern V60 is, the higher the resonant frequency fr2 of the LC series resonator SLC is (see Equation (2)). Accordingly, the frequency at the attenuation pole of the band pass filter 1 is high. In the band pass filter 1, the frequency at the attenuation pole of the band pass filter 1 is also able to be adjusted along with the resonant frequency by adjusting the length of the inductor via conductive pattern V60.

Figure 7:
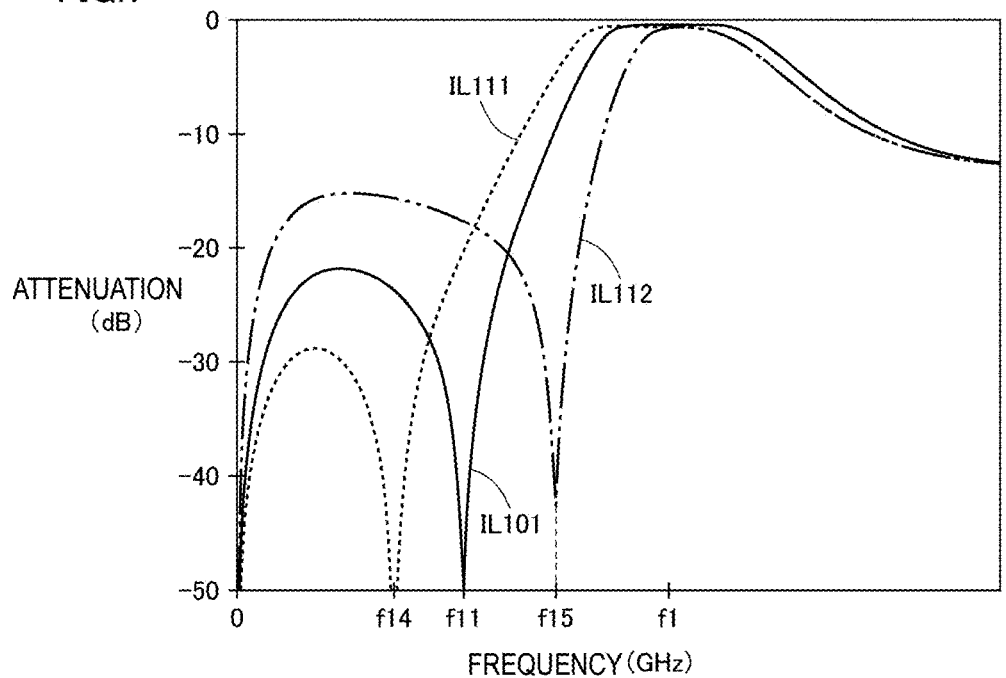
FIG. 7 is a diagram illustrating insertion losses obtained when the area of a capacitor conductive pattern (the capacitance of a capacitor included in an LC series resonator) is changed in three steps.

FIG. 7 is a diagram illustrating insertion losses IL111, IL101, and IL112 obtained when the area of the capacitor conductive pattern 20 (the capacitance of the capacitor C2) is changed in three steps. The insertion loss IL101 illustrated in FIG. 7 is the same as the insertion loss IL101 illustrated in FIG. 6. The insertion losses IL111, IL101, and IL112 are obtained when the areas of the capacitor conductive pattern 20 are S21 to S23 (S21>S22>S23), respectively. Frequencies at the attenuation poles of the band pass filter 1 which are obtained in the case of the insertion losses IL111 and IL112 are f14 and f15 (f14<f11<f15), respectively.

The smaller the area of the capacitor conductive pattern 20 is, the smaller the capacitance of the capacitor C2 is. Since the resonant frequency fr2 of the LC series resonator SLC is high when the capacitance of the capacitor is small (see Equation (2)), the frequency at the attenuation pole of the band pass filter 1 is high. The resonant frequencies of the band pass filter 1 that are obtained in the case of the insertion losses IL111, IL101, and IL112 change with the change in the capacitance of the capacitor C2 (see Equation (1)). The changes in the insertion loss at frequencies greater than or equal to the resonant frequencies are the same or substantially the same in the case of the insertion losses IL111, IL101, and IL112. That is, the change in the area of the capacitor conductive pattern 20 has little or no influence on the bandpass characteristics of the band pass filter 1. The frequency at the attenuation pole of the band pass filter 1 is able to be adjusted by adjusting the area of the capacitor conductive pattern 20 with little or no influence on the bandpass characteristics of the band pass filter 1.

Figure 8:
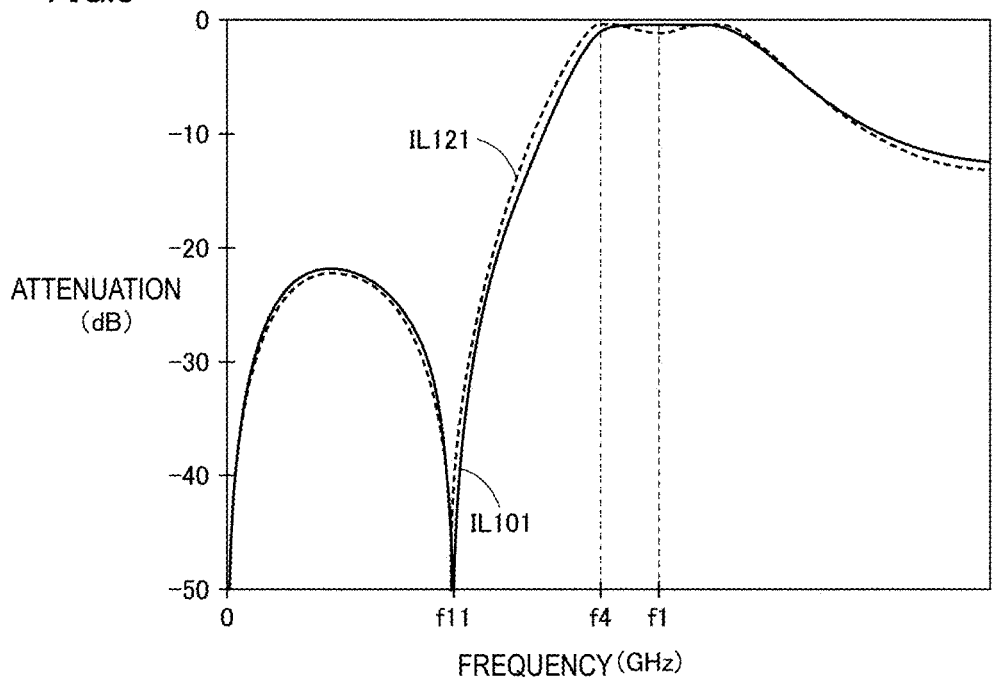
FIG. 8 is a diagram illustrating insertion losses obtained when the distance between a capacitor conductive pattern and a ground conductive pattern (the capacitance of a capacitor included in an LC parallel resonator) is changed in two steps.

FIG. 8 is a diagram illustrating insertion losses IL101 and IL121 obtained when the distance between the capacitor conductive pattern 60 and the ground conductive pattern 71 (the capacitance of the capacitor C1) is changed in two steps. The insertion loss IL101 illustrated in FIG. 8 is the same as the insertion loss IL101 illustrated in FIG. 6. The insertion losses IL101 and IL121 are obtained when the distances between the capacitor conductive pattern 60 and the ground conductive pattern are D21 and D22 (D21>D22), respectively. The resonant frequency of the band pass filter 1 which is obtained in the case of the insertion loss IL121 is a frequency f4 (f4<f1).

The shorter the distance between the capacitor conductive pattern 60 and the ground conductive pattern 71 is, the larger the capacitance of the capacitor C1 is. When the capacitance of the capacitor is large, the resonant frequency of the band pass filter 1 is low because the resonant frequency fr1 of an LC parallel resonator PLC is low (see Equation (1)). Frequencies at attenuation poles that are obtained in the case of the insertion losses IL121 and IL101 are located near the frequency f11 and are the same or substantially the same. The resonant frequency is able to be adjusted by adjusting the distance between the capacitor conductive pattern 60 and the ground conductive pattern 71 with little or no change in the frequency at the attenuation pole of the band pass filter 1.

Figure 9:
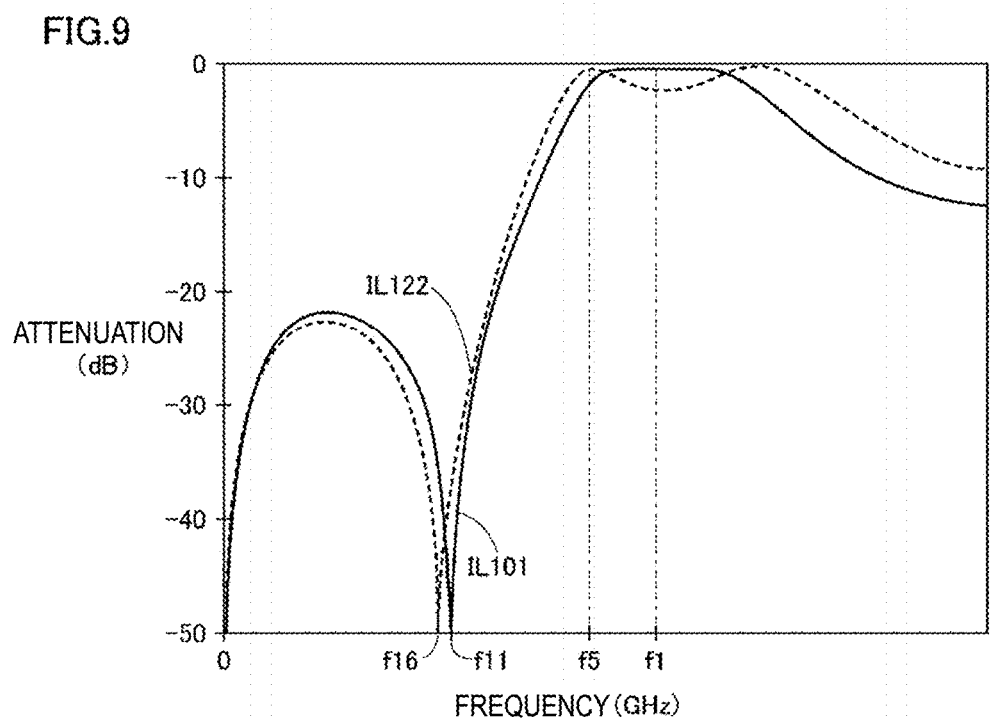
FIG. 9 is a diagram illustrating insertion losses obtained when the area of a capacitor conductive pattern (the capacitance of a capacitor included in an LC parallel resonator) is changed in two steps.

FIG. 9 is a diagram illustrating insertion losses IL101 and IL122 obtained when the area of the capacitor conductive pattern 60 (the capacitance of the capacitor C1) is changed in two steps. The insertion loss IL101 illustrated in FIG. 9 is the same as the insertion loss IL101 illustrated in FIG. 6. The insertion losses IL101 and IL122 are obtained when the areas of the capacitor conductive pattern 60 are S11 and S12 (S11<S12), respectively. The resonant frequency and the frequency at the attenuation pole that are obtained in the case of the insertion loss IL122 are a frequency f5 (f5<f1) and a frequency f16 (f16<f11), respectively.

The larger the area of the capacitor conductive pattern 60 is, the larger the capacitance of the capacitor C1 is. In this case, the resonant frequency of the band pass filter 1 is low because the resonant frequency fr1 of the LC parallel resonator PLC is low (see Equation (1)). This correspondence is the same or substantially the same as the correspondence illustrated in FIG. 8. However, in FIG. 9, the difference between the frequencies at the attenuation poles obtained in the case of the insertion losses IL101 and IL122 is larger than the difference illustrated in FIG. 8.

When the area of the capacitor conductive pattern 60 is changed, the change in electric field distribution occurs in the capacitor C1 and the non-negligible change in the coupling state between the capacitors C1 and C2 may occur. In this case, the change in the area of the capacitor conductive pattern 60 has non-negligible influences on not only the resonant frequency of the LC resonator 10 but also the resonant frequency of the LC series resonator SLC. As a result, the non-negligible change in the frequency at the attenuation pole of the band pass filter 1 may occur.

On the other hand, when the distance between the capacitor conductive pattern 60 and the ground conductive pattern is changed, there is little or no change in electric field distribution in the capacitor C1. Since the coupling state between the capacitors C1 and C2 changes very little, the frequency at the attenuation pole of the band pass filter 1 changes very little even if the area of the capacitor conductive pattern 60 is changed.

The resonant frequency of the band pass filter 1 is able to be adjusted by adjusting the distance between the capacitor conductive pattern 60 and the ground conductive pattern 71 or the area of the capacitor conductive pattern 60. However, so as not to change the frequency at the attenuation pole of the band pass filter 1, it is preferable that the adjustment of the distance between the capacitor conductive pattern 60 and the ground conductive pattern 71 is performed.

In a case in which the band pass filter 1 including a laminate body is manufactured, a conductive pattern provided on a dielectric layer is preferably changed for the adjustment of the area of the capacitor conductive pattern 60. On the other hand, the adjustment of the distance between the capacitor conductive pattern 60 and the ground conductive pattern 71 is able to be performed by changing the thickness of a dielectric layer. Accordingly, the adjustment of the distance between the capacitor conductive pattern 60 and the ground conductive pattern 71 is easier to perform than the adjustment of the area of the capacitor conductive pattern 60. From the viewpoint of ease of adjustment, it is preferable that the adjustment of the distance between the capacitor conductive pattern 60 and the ground conductive pattern 71 is performed.

Thus, in an LC filter according to the first preferred embodiment, one end of the inductor is isolated in a direct current from the ground node by the first capacitor and the other end of the inductor is isolated in a direct current from the ground node by the second capacitor. Since the inductor is isolated in a direct current from the ground electrode connected to the ground node, the ground electrode and another conductor connected to the ground electrode are prevented from defining and functioning as inductors. As a result, the deviation of the characteristics of the LC filter from desired characteristics is able to be reduced or prevented.

In the first preferred embodiment, both of the resonant frequency of the band pass filter and the frequency at the attenuation pole of the band pass filter are able to be adjusted by adjusting the length of the inductor via conductive pattern. The resonant frequency of the band pass filter is able to be adjusted by adjusting the distance between the conductive patterns defining the first capacitor or the area of the conductive pattern. The frequency at the attenuation pole of the band pass filter is able to be adjusted by adjusting the distance between the conductive patterns defining the second capacitor while having little or no influence on the bandpass characteristics of the band pass filter.

Second Preferred Embodiment

In the first preferred embodiment, a case in which an LC filter includes a single LC resonator is described. An LC filter according to preferred embodiments of the present invention may include a plurality of LC resonators. In a second preferred embodiment of the present invention, a case in which an LC filter includes four LC resonators, for example, will be described.

Figure 10:
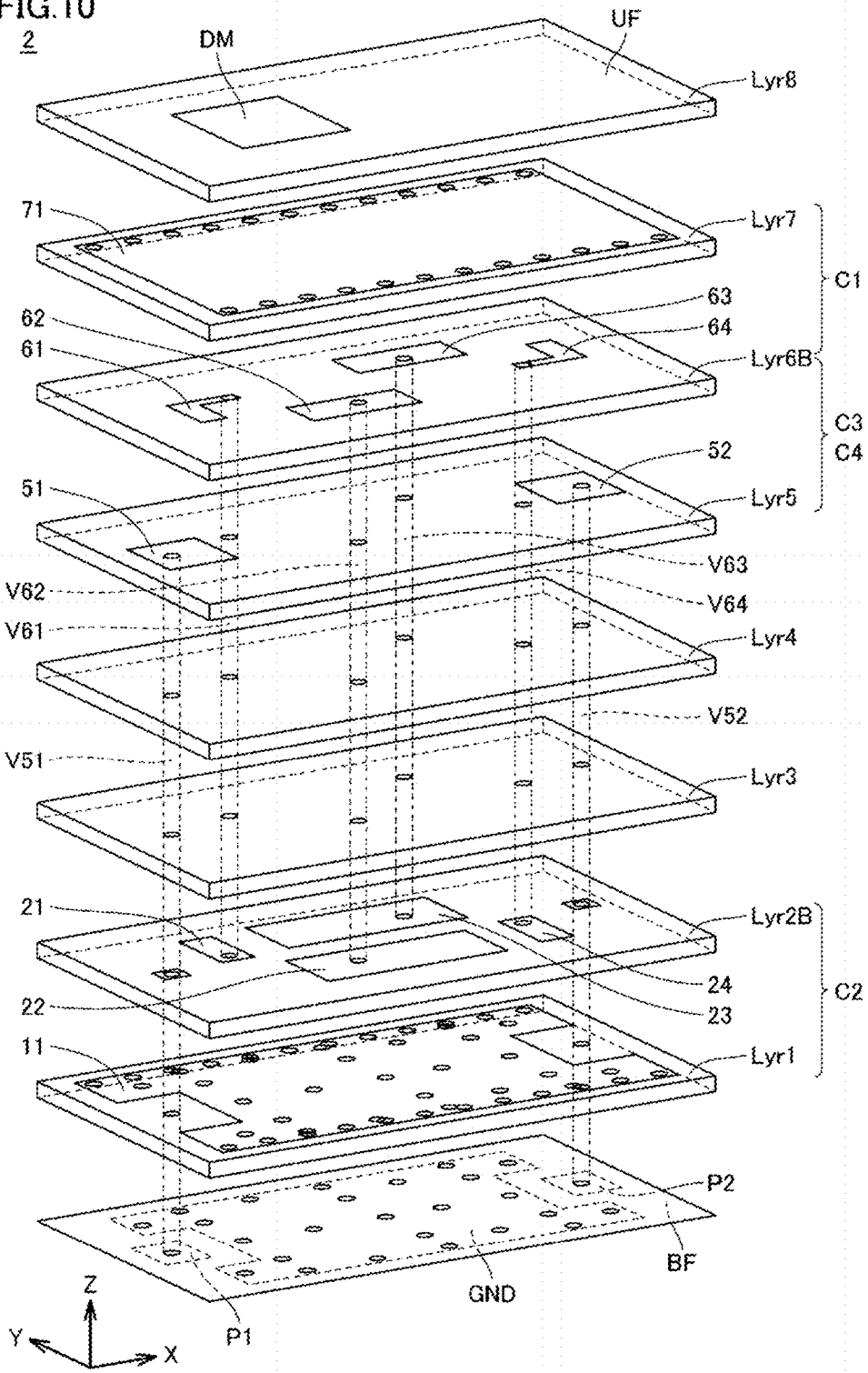
FIG. 10 is an exploded perspective view illustrating an exemplary layered structure of a band pass filter according to a second preferred embodiment of the present invention.

FIG. 10 is an exploded perspective view illustrating an example layered structure of a band pass filter 2 according to the second preferred embodiment. In FIG. 10, the dielectric layers Lyr2 and Lyr6 illustrated in FIG. 4 are replaced with dielectric layers Lyr2B and Lyr6B, respectively. Dielectric layers other than the dielectric layers Lyr2B and Lyr6B are the same or substantially the same as those illustrated in FIG. 4, and the description thereof will be omitted.

On the dielectric layer Lyr2B, capacitor conductive patterns 21 to 24 are provided. On the dielectric layer Lyr6B, capacitor conductive patterns 61 to 64 are provided. The capacitor conductive patterns 61 to 64 are connected to the capacitor conductive patterns 21 to 24 by inductor via conductive patterns V61 to V64, respectively.

Figure 11:
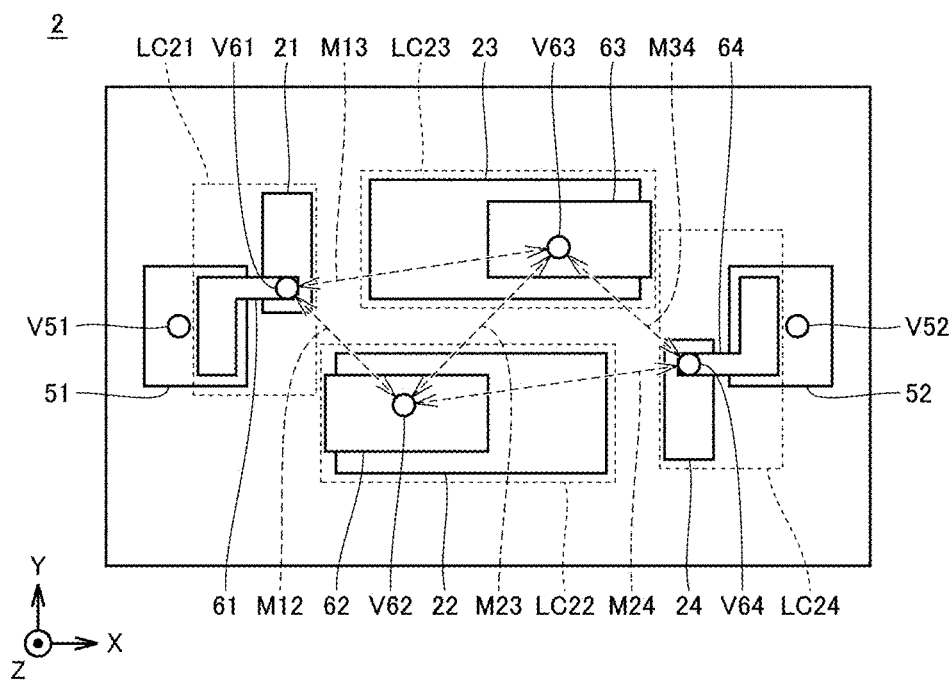
FIG. 11 is a plan view of the band pass filter illustrated in FIG. 10 which is viewed in plan in a lamination direction.

FIG. 11 is a plan view of the dielectric layers Lyr6B to Lyr2B in the band pass filter 2 illustrated in FIG. 10 which are viewed in plan in a lamination direction. As illustrated in FIG. 11, the band pass filter 2 includes LC resonators LC21 to LC24. The LC resonators LC21 to LC23 are adjacent to one another. The LC resonator LC24 is adjacent to the LC resonators LC22 and LC23.

The LC resonator LC21 includes the capacitor conductive patterns 21 and 61 and the inductor via conductive pattern V61 that connects the capacitor conductive patterns 21 and 61. The capacitor conductive pattern 61 defines the capacitor C3 along with the capacitor conductive pattern 51 and DC-disconnects the inductor via conductive pattern V61 from the input/output terminal P1.

The LC resonator LC22 includes the capacitor conductive patterns 22 and 62 and the inductor via conductive pattern V62 that connects the capacitor conductive patterns 22 and 62. The LC resonator LC23 includes the capacitor conductive patterns 23 and 63 and the inductor via conductive pattern V63 that connects the capacitor conductive patterns 23 and 63.

The LC resonator LC24 includes the capacitor conductive patterns 24 and 64 and the inductor via conductive pattern V64 that connects the capacitor conductive patterns 24 and 64. The capacitor conductive pattern 64 defines the capacitor C4 along with the capacitor conductive pattern 52 and DC-disconnects the inductor via conductive pattern V64 from the input/output terminal P2.

Since the LC resonators LC21 to LC23 are adjacent to one another, magnetic coupling is generated between respective inductor via conductive patterns in the LC resonators LC21 to LC23. That is, magnetic coupling M12 is generated between the inductor via conductive pattern V61 and V62. Magnetic coupling M23 is generated between the inductor via conductive patterns V62 and V63. Magnetic coupling M13 is generated between the inductor via conductive patterns V61 and V63. Magnetic coupling is coupling via a magnetic flux which occurs such that a magnetic flux between inductors changes in accordance with the change in a current flowing through one of the inductors and induced electromotive force is generated at the other one of the inductors.

Since the LC resonator LC24 is adjacent to the LC resonators LC22 and LC23, magnetic coupling is generated between the LC resonators LC22 and LC24 and between the LC resonators LC23 and LC24. That is, magnetic coupling M24 is generated between the inductor via conductive patterns V62 and V64. Magnetic coupling M34 is generated between the inductor via conductive patterns V63 and V64.

In the band pass filter 2, the LC resonators LC21 to LC24 are not linearly arranged, and are arranged in a staggered pattern such that each of the LC resonators is adjacent to two of the LC resonators. By arranging the LC resonators LC21 to LC24 in a staggered pattern, the degree of magnetic coupling between LC resonators is increased as compared with a case in which they are linearly arranged. As a result, the transmission of a signal between inductors is facilitated and the pass band of the band pass filter 2 is able to be expanded.

By arranging the LC resonators LC21 to LC24 in a staggered pattern, limited space in the laminate body is able to be more effectively used as compared with a case in which they are linearly arranged. As a result, dead space is reduced in the laminated body and the band pass filter 2 is able to be reduced in size or miniaturized.

Figure 12:
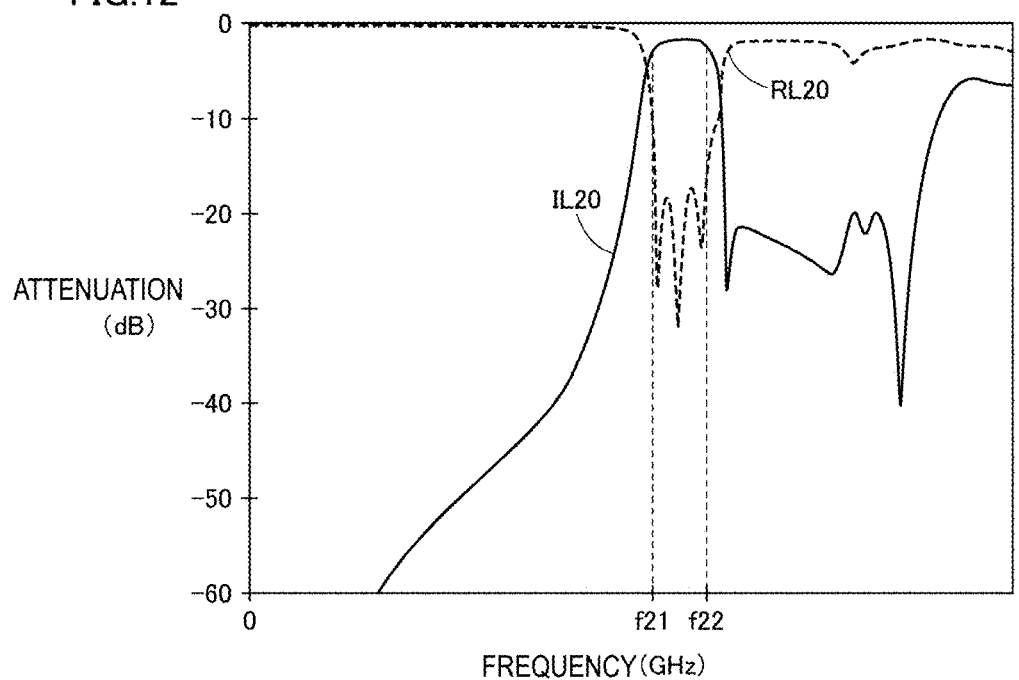
FIG. 12 is a diagram illustrating an insertion loss and a return loss of the band pass filter illustrated in FIG. 10.

FIG. 12 is a diagram illustrating an insertion loss IL20 and a return loss RL20 of the band pass filter 2 illustrated in FIG. 10. The larger the absolute value of an attenuation is, the larger the return loss is. This means that the larger the return loss is, a higher proportion of signals input into the band pass filter 2 is not reflected in the band pass filter 2 and is not returned. It is therefore preferable that the return loss is large.

As illustrated in FIG. 12, in a frequency band between the frequencies f21 and f22, the attenuation approaches 0 and the insertion loss IL20 becomes substantially flat. In the frequency band between the frequencies f21 and f22, the maximum return loss RL20 occurs. In the band pass filter 2, in the frequency band between the frequencies f21 and f22 in which the insertion loss IL20 is flat and the minimum insertion loss IL20 occurs, the maximum return loss occurs. Thus, the typical characteristics of a practical band pass filter are achieved.

In the frequency band between the frequencies f21 and f22, the maximum value and the minimum value of the return loss RL20 alternately occur. Such a change of the return loss RL20 is a typical change that occurs when a plurality of LC resonators are magnetically coupled. The magnetic coupling between a plurality of LC resonators achieves expansion of the pass band of the band pass filter 2.

As described above, in an LC filter according to the second preferred embodiment, first ends of respective inductors in the first to fourth LC resonators are isolated in a direct current from the ground node by the first capacitor and second ends of the respective inductors are isolated in a direct current from the ground node by the second capacitor. Since the respective inductors in the first to fourth LC resonators are isolated in a direct current from the ground electrode connected to the ground node, the ground electrode and another conductor connected to the ground electrode are prevented from defining and functioning as inductors. As a result, the deviation of the characteristics of the LC filter from desired characteristics is able to be reduced or prevented.

In the second preferred embodiment, the first to third LC resonators are adjacent to one another. The fourth LC resonator is adjacent to the second and third LC resonators. Accordingly, magnetic coupling is generated between the respective resonators. As a result, the performance of the LC filter is able to be improved. Since the first to fourth LC resonators are arranged in a staggered pattern, the LC filter is able to be reduced in size or miniaturized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC resonator comprising:
   a plurality of dielectric layers laminated in a lamination direction;
   a first capacitor;
   a second capacitor;
   an inductor connected between the first capacitor and the second capacitor;
   a first ground conductive pattern provided on a first dielectric layer of the plurality of dielectric layers;
   a second ground conductive pattern provided on a second dielectric layer of the plurality of dielectric layers;
   a first capacitor conductive pattern provided on a third dielectric layer of the plurality of dielectric layers located between the first dielectric layer and the second dielectric layer, and defining the first capacitor along with the first ground conductive pattern;
   a second capacitor conductive pattern provided on a fourth dielectric layer of the plurality of dielectric layers located between the second dielectric layer and the third dielectric layer, and defining the second capacitor along with the second ground conductive pattern; and
   an inductor via conductive pattern that connects the first capacitor conductive pattern and the second capacitor conductive pattern and defines and functions as the inductor; wherein
   a first end of the inductor is isolated in a direct current from a ground node by the first capacitor and a second end of the inductor is isolated in a direct current from the ground node by the second capacitor.

2. An LC filter comprising:
   first, second, and third LC resonators according to claim 1; wherein
   the first, second, and third LC resonators are adjacent to one another.

3. The LC filter according to claim 2, wherein the first, second, and third LC resonators are arranged in a staggered pattern.

4. The LC resonator according to claim 1, wherein an area of the first capacitor conductive pattern differs from an area of the second capacitor conductive pattern.

5. The LC resonator according to claim 1, wherein a distance between the first capacitor conductive pattern and the first ground conductive pattern differs from a distance between the second capacitor conductive pattern and the second ground conductive pattern.

6. An LC filter comprising:
   the LC resonator according to claim 1;
   a first terminal;
   a second terminal;
   a third capacitor; and
   a fourth capacitor; wherein
   the first end of the inductor is isolated in a direct current from the first terminal by the third capacitor and is isolated in a direct current from the second terminal by the fourth capacitor.

7. The LC resonator according to claim 1, wherein the first ground conductive pattern is connected to the second ground conductive pattern by a plurality of via conductive patterns.

8. An LC filter comprising:
   an LC resonator including:
      a plurality of dielectric layers laminated in a lamination direction;
      a first capacitor;
      a second capacitor; and
      an inductor connected between the first capacitor and the second capacitor;
   a first terminal;
   a second terminal;
   a third capacitor;
   a fourth capacitor;
   a first ground conductive pattern provided on a first dielectric layer of the plurality of dielectric layers;
   a second ground conductive pattern provided on a second dielectric layer of the plurality of dielectric layers;
   a first capacitor conductive pattern provided on a third dielectric layer of the plurality of dielectric layers located between the first dielectric layer and the second dielectric layer, and defining the first capacitor along with the first ground conductive pattern;
   a second capacitor conductive pattern provided on a fourth dielectric layer of the plurality of dielectric layers located between the second dielectric layer and the third dielectric layer, and defining the second capacitor along with the second ground conductive pattern; and
   an inductor via conductive pattern that connects the first capacitor conductive pattern and the second capacitor conductive pattern and defines and functions as the inductor; wherein
   a first end of the inductor is isolated in a direct current from a ground node by the first capacitor and a second end of the inductor is isolated in a direct current from the ground node by the second capacitor; and
   the first end of the inductor is isolated in a direct current from the first terminal by the third capacitor and is isolated in a direct current from the second terminal by the fourth capacitor.

9. The LC filter according to claim 8, wherein an area of the first capacitor conductive pattern differs from an area of the second capacitor conductive pattern.

10. The LC filter according to claim 8, wherein a distance between the first capacitor conductive pattern and the first ground conductive pattern differs from a distance between the second capacitor conductive pattern and the second ground conductive pattern.

11. The LC filter according to claim 8, wherein the first ground conductive pattern is connected to the second ground conductive pattern by a plurality of via conductive patterns.

12. An LC filter comprising:
   first, second, and third LC resonators each including:
      a plurality of dielectric layers laminated in a lamination direction;
      a first capacitor;
      a second capacitor; and an inductor connected between the first capacitor and the second capacitor;

a first ground conductive pattern provided on a first dielectric layer of the plurality of dielectric layers;

a second ground conductive pattern provided on a second dielectric layer of the plurality of dielectric layers;

a first capacitor conductive pattern provided on a third dielectric layer of the plurality of dielectric layers located between the first dielectric layer and the second dielectric layer, and defining the first capacitor along with the first ground conductive pattern;

a second capacitor conductive pattern provided on a fourth dielectric layer of the plurality of dielectric layers located between the second dielectric layer and the third dielectric layer, and defining the second capacitor along with the second ground conductive pattern; and an inductor via conductive pattern that connects the first capacitor conductive pattern and the second capacitor conductive pattern and defines and functions as the inductor; wherein in each of the first, second, and third LC resonators, a first end of the inductor is isolated in a direct current from a ground node by the first capacitor and a second end of the inductor is isolated in a direct current from the ground node by the second capacitor; and the first, second, and third LC resonators are adjacent to one another.

13. The LC filter according to claim 12, wherein the first ground conductive pattern is connected to the second ground conductive pattern by a plurality of via conductive patterns.

14. The LC filter according to claim 12, wherein an area of the first capacitor conductive pattern differs from an area of the second capacitor conductive pattern.

15. The LC filter according to claim 12, wherein a distance between the first capacitor conductive pattern and the first ground conductive pattern differs from a distance between the second capacitor conductive pattern and the second ground conductive pattern.

16. An LC filter comprising:
first, second, third, and fourth LC resonators each including:
a plurality of dielectric layers laminated in a lamination direction;
a first capacitor;
a second capacitor; and
an inductor connected between the first capacitor and the second capacitor;
a first terminal;
a second terminal;
a third capacitor; and
a fourth capacitor; wherein
in each of the first, second, third, and fourth LC resonators, a first end of the inductor is isolated in a direct current from a ground node by the first capacitor and a second end of the inductor is isolated in a direct current from the ground node by the second capacitor;
the first, second, and third LC resonators are adjacent to one another;
the first end of the inductor in the first LC resonator is isolated in a direct current from the first terminal by the third capacitor;
a first end of the fourth LC resonator is isolated in a direct current from the second terminal by the fourth capacitor; and
the fourth LC resonator is adjacent to the second LC resonator and the third LC resonator.

17. The LC filter according to claim 16, further comprising:
a first ground conductive pattern provided on a first dielectric layer of the plurality of dielectric layers;
a second ground conductive pattern provided on a second dielectric layer of the plurality of dielectric layers;
a first capacitor conductive pattern provided on a third dielectric layer of the plurality of dielectric layers located between the first dielectric layer and the second dielectric layer, and defining the first capacitor along with the first ground conductive pattern;
a second capacitor conductive pattern provided on a fourth dielectric layer of the plurality of dielectric layers located between the second dielectric layer and the third dielectric layer, and defining the second capacitor along with the second ground conductive pattern; and
an inductor via conductive pattern that connects the first capacitor conductive pattern and the second capacitor conductive pattern and defines and functions as the inductor.

18. The LC filter according to claim 17, wherein the first ground conductive pattern is connected to the second ground conductive pattern by a plurality of via conductive patterns.

19. The LC filter according to claim 16, wherein the first, second, third, and fourth LC resonators are arranged in a staggered pattern.

* * * * *